United States Patent [19]
Schwarzschild et al.

[11] 3,863,436
[45] Feb. 4, 1975

[54] SOLID STATE QUARTZ WATCH

[75] Inventors: Jack Schwarzschild, Stamford, Conn.; Raymond Robert Boxberger, So. Nyack, N.Y.

[73] Assignee: Timex Corporation, Waterbury, Conn.

[22] Filed: Apr. 18, 1974

[21] Appl. No.: 462,151

[52] U.S. Cl. ........................ 58/50 R, 58/53, 174/52, 317/101, 340/336
[51] Int. Cl.... G04b 19/30, G04b 37/14, H02g 3/08
[58] Field of Search ............. 58/50 R, 53; 174/52 R, 174/52 PE; 317/101 R, 101 CC; 340/336

[56] References Cited

UNITED STATES PATENTS 3,718,842 2/1973 Abbott et al. ............ 350/160 LC X
3,757,510 9/1973 Dill ................................... 58/50 R
3,793,474 2/1974 Dunn ............................. 174/52 PE

*Primary Examiner*—Edith Simmons Jackmon

[57] ABSTRACT

A solid state quartz watch has an electrooptical digital display, a printed circuit substrate with an integrated circuit mounted thereon for providing driving signals to the display to indicate the time, an intermediate connector member positioning the display and the substrate with respect to one another and electrically connecting them, a backing member holding the substrate in the connector member with openings therein for holding a battery and making adjustments, and a spring clip holding the assembly together in a module or "sandwich."

9 Claims, 9 Drawing Figures

SOLID STATE QUARTZ WATCH

This invention relates generally to horological devices and, more particularly, to solid state electronic wristwatches with electrooptical displays for indicating the time and employing integrated digital circuitry using binary dividers to reduce the frequency of a quartz crystal time reference.

Electronic wristwatches are known which have printed circuit substrates with integrated circuit components mounted thereon. U.S. Pat. No. 3,759,031 to McCullough et al. issued Sept. 18, 1973 and U.S. Pat. No. 3,778,999 to Buffray issued Dec. 18, 1973 are exemplary of prior art efforts to provide suitable constructions to connect the necessary electrical circuits to the time display. It is also well known to provide digital circuitry for reducing the frequency of a quartz crystal time reference and to use it to actuate an electrooptical display. Exemplary of such patents are U.S. Pat. No. 3,721,084 to Dargent issued Mar. 20, 1973; U.S. Pat. No. 3,757,509 to Fujita issued Sept. 11, 1973, these patents being merely representative of many such arrangements.

In order to provide for economical construction of electronic wristwatches, and repair or replacement of component parts, it is desirable that the electrooptical display component and that the component containing electrical circuitry be separate members, and yet that all of the components can be easily assembled in a shock-resistant module for incorporating in a wristwatch case with a battery and having means to make external tests and adjustments without undue difficulty. It is also desirable to provide for economies of manufacture of the substrate containing the electronic circuitry using single layer "thick film" printing.

Accordingly, one object of the present invention is to provide an improved shock-resistant module of separable components for an electronic solid state quartz wristwatch.

Another object of the invention is to provide an improved construction for a substrate carrying electrical components and integrated circuitry and for connecting the substrate to an electrooptical display for indicating the time in a wristwatch.

SUMMARY OF THE INVENTION

Briefly stated, the invention comprises a watch assembly with electrooptical display having electrical contact terminals on an undersurface, a substrate with an integrated circuit mounted thereon connected via printed circuit leads to electrical terminals on the substrate, an intermediate connector positioning the display and substrate with respect to one another and providing electrical connections between the contact terminals on the display and on the substrate, and a spring clip holding the members together in a module. The module may also include a backing member holding the substrate and having openings for making external tests and adjustments on the substrate components.

DRAWING

The foregoing objects and advantages will be more clearly understood by reference to the following description and the accompanying drawings in which:

FIG. 1 is a elevation drawing, partly in cross section illustrating the assembled module, FIG. 2 is a plan view of an electrooptical display, FIG. 3 is a block diagram illustrating functions performed in a suitable integrated circuit, FIGS. 4 and 5 are plan view of front and back sides of a printed circuit substrate, FIG. 6 is a partial circuit for the oscillator components on the substrate outside the integrated circuit, FIG. 7 is a circuit diagram of a display driver power supply, and FIGS. 8 and 9 are front and rear plan views of the module assembly.

DESCRIPTION OF THE PREFERRED EMBODIMENT

Figure 1:
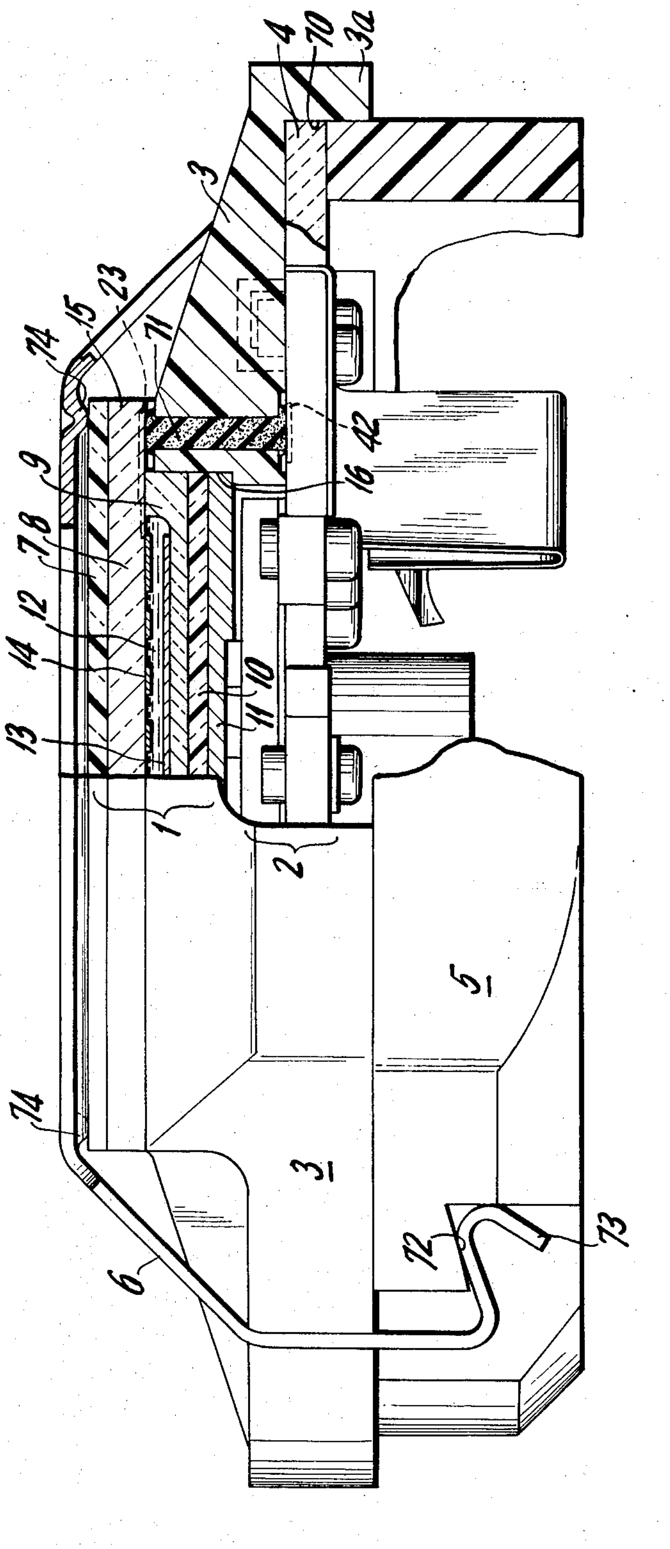

Referring to FIG. 1 of the drawing, an electrooptical display 1 is positioned with respect to a substrate subassembly 2 by means of an intermediate connector member 3. The substrate subassembly 2 is mounted on a ceramic substrate 4 held in place by a backing member 5 and a spring clip 6.

Electrooptical display 1 may be any of the various types suggested in the prior art such as liquid crystal, electrophoretic, light emitting diode, electrochromic, etc. having the common characteristic that timeindicating characters are made visible on the viewing surface by providing suitable coded electrical signals to the display. The type of display shown in the preferred embodiment is a liquid crystal display of the "field effect" type which is commercially available and comprises a sandwich construction of a transparent polarizing layer 7, a glass layer 8, another glass layer 9, sealed thereto, another transparent polarizing layer 10, and a reflecting layer 11. A chamber between the glass layers 8, 9 contains liquid crystal material 12 suitable for display use in the twisted-nematic field-effect mode. A common transparent electrode layer 13 and separately energizable transparent electrodes 14 complete the display 1. Its operation is well known in the art.

Glass layer 8 of the display projects to form a ledge 15 providing electrical contact terminals 23 on its underside. The display is located in connector member 3 by means of a recess 16 with a bottom ledge on which the display 1 rests.

Figure 2:
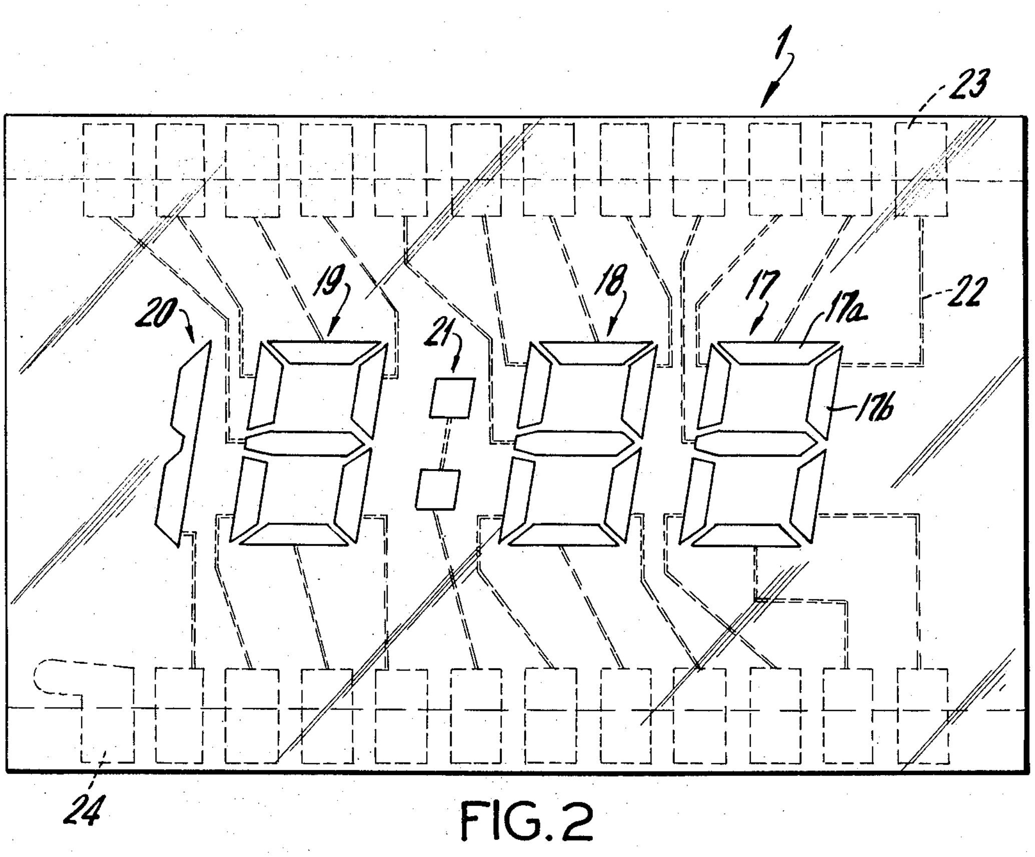

Further details of the electrooptical display illustrated in FIG. 1 may be seen by reference to FIG. 2. Although any suitable characters for indicating the time could be used, the display indicated is a seven segment digital display for indicating hours and minutes. Another suitable type of display might be a pseudo-analog display imitating conventional watch hands as suggested in U.S. Pat. No. 3,540,209 to Zatsky et al. issued Nov. 17, 1970. Also cumulative type displays using dots or bar graphs to indicate selected intervals of time in progressive or cumulative fashion may be chosen.

The display indicated in FIG. 2 includes 7-segment characters 17, 18, 19, a single segment character 20 and "colon" characters 21. The 7-segment characters, such as 17 are made up individually energizable segments such as 17*a*, 17*b*, etc. Each segment such as 17*b* is connected by a lead 22 to a respective conductive layer 23 which extends to form an electrical contact terminal which is exposed on the underside of the glass ledge 15 (see FIG. 1). A "common" contact terminal 24 is connected to the transparent conductive layer 13 on the other side of the liquid crystal material, so that a voltage gradient across the liquid crystal material can be established to energize the desired segment.

Figure 3:
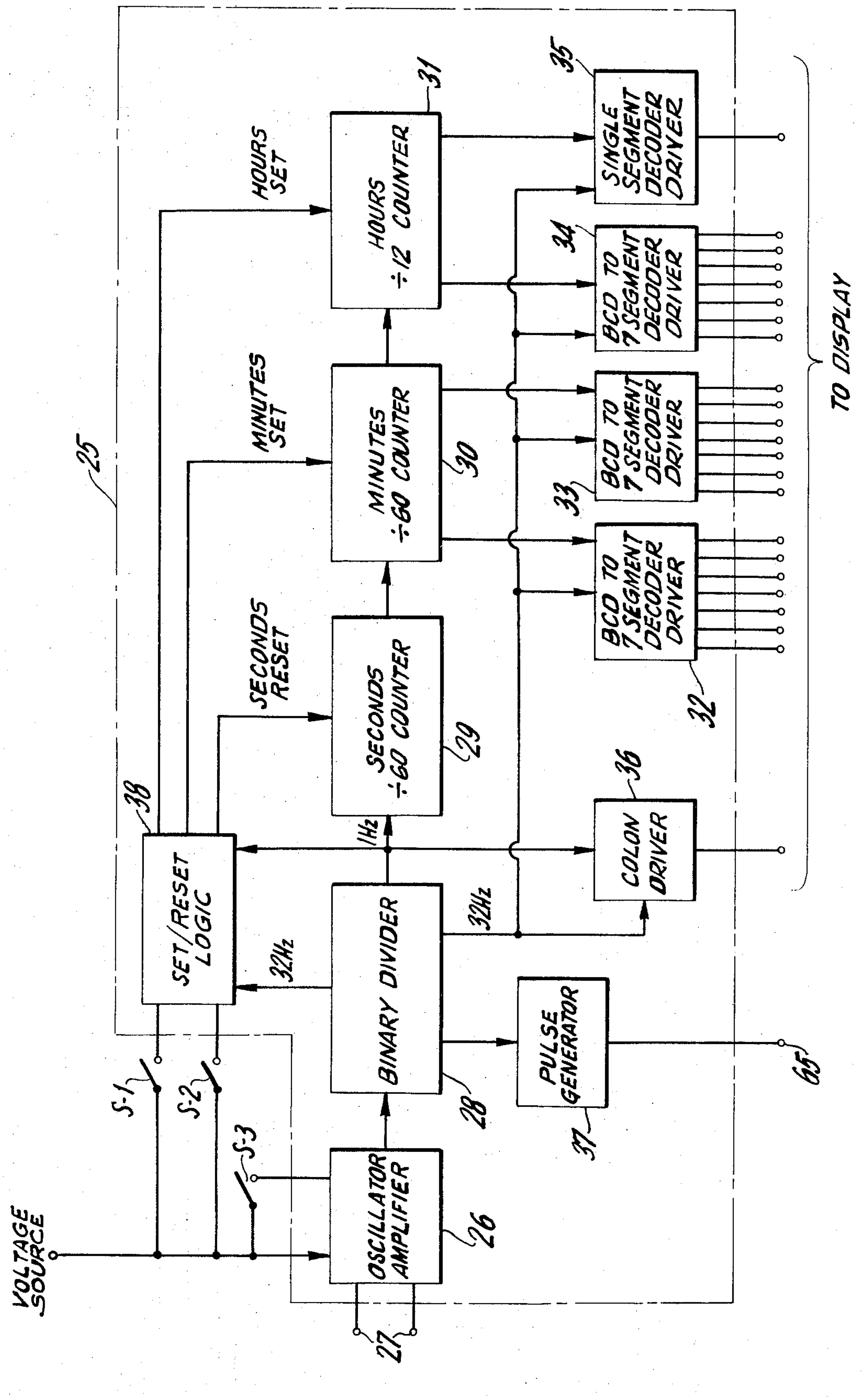

Referring now to FIG. 3 of the drawing, the block diagram illustrates functions which are carried out in an integrated circuit "chip" depicted by the phantom line enclosure 25. An amplifier 26 cooperates with external circuit elements later to be described, via terminals 27, to provide a high frequency oscillator vibrating at 32,896 Hz, controlled by a piezoelectric quartz crystal.

A divider 28 comprising 15 "divide-by-two" stages reduces the frequency of the incoming impulses to 1 Hz. The signal is divided by 60 in a "seconds" counter 29 which includes a reset capability. The signal is divided again by 60 in a "minutes" counter 30 and divided again by 12 in a "hours" counter 31. The latter two counters 30, 31 provide binary coded decimal (BCD) outputs to a 7-segment decoder driver 32 for indicating minutes in the "ones" place, an identical decoder driver 33 for indicating minutes in the "tens" place, an identical decoder driver 34 for indicating hours in the "ones" place, and a single segment decoder driver 35 for indicating hours in the "tens" place. The corresponding display character for the latter is either "1" or blank in a 12 hour display, hence only one segment need be driven.

Another single segment decoder driver 36, which may be identical to the aforementioned driver 35 actuates the colon, which receives a 1 Hz input causing it to flash at a 1 Hz rate. The aforementioned drivers 32–36 are activated by a 32 Hz signal taken at a suitable interstage point on the divider 28.

Since the liquid crystal segments normally require a higher driving voltage than is provided by the small energy cell in the watch, an external circuit to be discussed in connection with FIG. 7 of the drawing elevates the display driving voltage supplied to drivers 32–36. This external circuit is provided with high frequency impluses form terminals 65 by a pulse generator 37.

The integrated circuit 25 also includes logic circuits for changing or updating the displayed time, this provision being indicated at 38. Logic block 38 provides capability to selectively advance the minutes or hours counters 30, 31 at a 1 Hz rate, and/or to reset the "seconds" counter 29 to zero by manipulation of external switches S–1, S–2. The watch may also be shut down by switch S–3.

The aforementioned functional blocks for the amplifiers, dividers, counters, drivers and other logic elements may be carried out by techniques well known to those skilled in the art using CMOS circuits to reduce power consumption.

Figure 4:
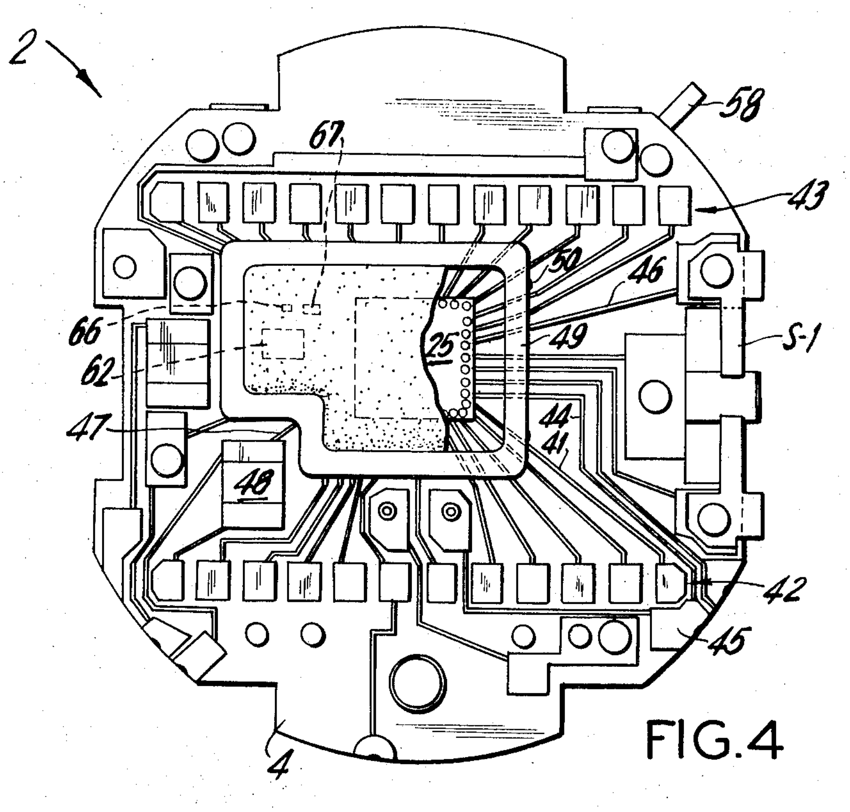
Figure 5:
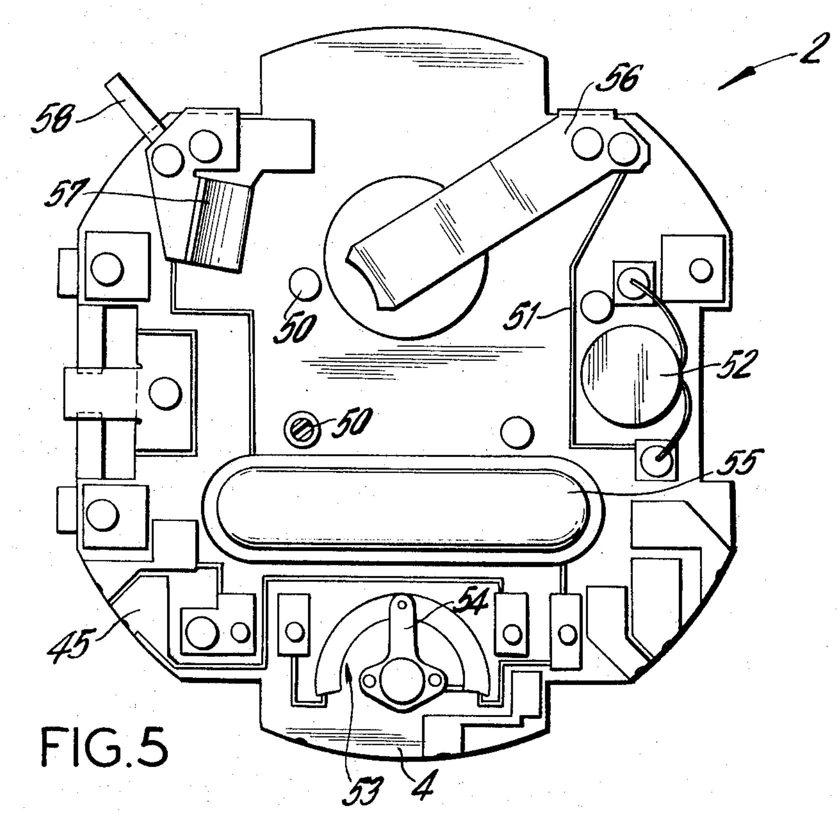

Referring now to FIGS. 4 and 5 of the drawing which are the front and back sides respectively of the substrate subassembly 2 shown in FIG. 1 of the drawing, the substrate itself comprises a flat ceramic plate 4 with printed circuits applied to both sides employing single layer thick film printing using conventional techniques. The substrate also serves as the mounting for the various electronic components to be discussed as well as the integrated circuit 25 and carries the switch and power supply contacts, as well as electrical contact terminals.

Referring first to FIG. 4, printed circuit leads are seen at 41 extending between the integrated circuit chip 25 and a layer of conductive material, forming an electrical contact terminal 42 on the upper surface of the substrate. Other printed circuit leads similar to 41 are provided for other contact terminals similar to 42, which extend generally in a row along the lower side. A similar row 43 of electrical contact terminals for the display is seen at the upper side. Terminals 42 are precisely aligned with respective terminals 23 on the display (FIG. 2).

The precise circuit arrangement of terminals or printed circuit leads leading to the integrated circuit chip 25 is not material to the present invention, so no attempt will be made to describe the circuit in detail.

Other printed circuit leads, such as 44, lead from the integrated circuit 25 to conductive inserts such as 45, which are exposed on both sides of the substrate (see FIG. 5) to form "test points" for making external tests of the circuit components.

Other printed circuit leads, such as 46, lead to switch elements (see FIG. 3).

Other printed circuit leads are connected to external components mounted on the substrate, such as lead 47 connected to a "chip" capacitor 48 bonded to the substrate.

The upper surface of substrate 4 provides the mounting area for integrated circuit 25 within a plastic dam 49, which is fastened to the substrate via heat deformable projections 50 protruding to the opposite side of the substrate. Integrated circuit chip 25 is wire-bonded to the printed circuit leads, and the cavity inside the dam which also contains discrete components 62, 66 and 67, is then filled with an encapsulant to protect the circuit and other components.

Referring to FIG. 5 showing the other side of the substrate, printed circuit leads such as 51 provide connections between the power supply and components such as coil 52. A variable resistor 53 is applied by thick film printing techniques, and wiper arm 54 adjusts the resistance to trim the oscillator frequency (see FIG. 6). The substrate also serves as mounting platform for the quartz crystal 55, negative battery terminal 56, and the positive battery terminaal 57 with an extending grounding tab 58. Tab 58 is adapted to ground the positive terminal of the energy cell to the metallic watch bezel.

Figure 6:
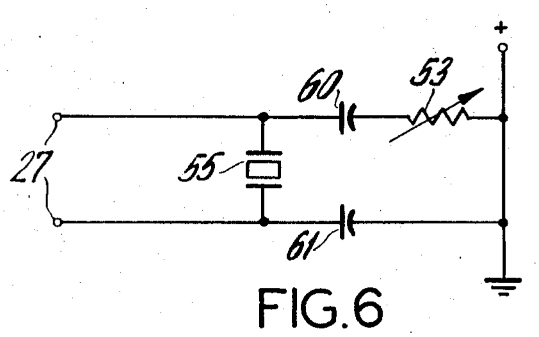
Figure 7:
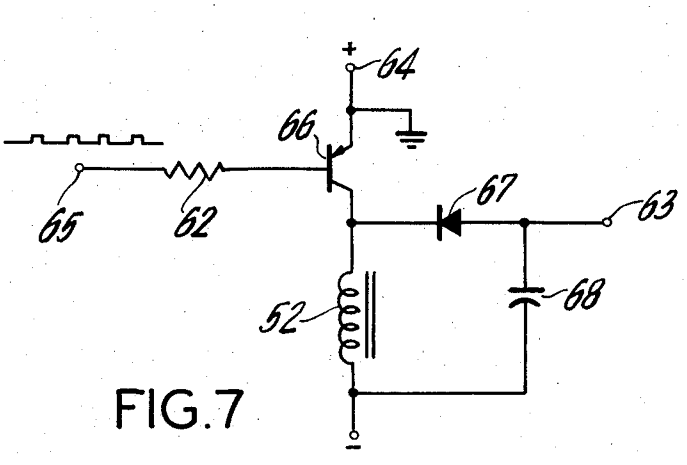

FIGS. 6 and 7 show circuit diagrams for some of the external components mounted on the substrate which are necessary to the operation of the watch. FIG. 6 shows the external oscillator tank circuit as described in more detail in assignee's co-pending application Ser. No. 297,151 filed Oct. 12, 1972 in the name of Keeler et al., now U.S. pat No. 3,803,828 issued Apr. 16, 1974. The circuit includes quartz crystal 55, one terminal of which is connected to ground via the series, combination of capacitor 60 and trimming resistor 53 while the other terminal is connected to ground via capacitor 61. This tank circuit, when connected via terminals 27 to the oscillator amplifier in the integrated circuit (see FIG. 3) causes oscillations at the natural frequency of the quartz crystal 55.

Referring to FIG. 7, a circuit is shown for increasing the voltage at a terminal 63 above battery voltage applied at a terminal 64 when pulses are applied at a terminal 65.

A PNP transistor 66 has its base connected to terminal 65 via resistor 62. Terminal 64 is grounded and connected via the emittercollector path to inductor coil 52. Terminal 63 is connected via a diode 67 to one side of the coil and via capacitor 68 to the other side of the coil. Intermittent pulses applied at 65 from the pulse generator 37 of the integrated circuit (see FIG. 3) cause transistor 66 to conduct intermittently so that the energy stored in coil 52 will cause a high voltage to be maintained across capacitor 68. This is a well-known circuit often termed a "fly-back" power supply. The voltage at terminal 63 is utilized as a power supply by the drivers 32–36 in the integrated circuit.

Reference to the substrate subassembly of FIGS. 4 and 5 will illustrate the location of most of the components in the circuit drawings of FIGS. 6 and 7, where the same reference numerals have been employed where possible.

Referring back now to FIG. 1 of the drawing, the manner of electrically connecting the substrate subassembly 2 and the display 1 will be described. The substrate 4 is located in a recess 70 on the underside of connector member 3 inside a skirt *3a*, so that the electrical contact terminals 42 on the upperside of the substrate are precisely aligned with the respective electrical contact terminals 23 on the underside of the display ledge 15. For each pair of terminals, a tiny electrically conductive rubber lead 71 passing through a hole in the connector member 3 makes contact between a pair of associated terminals 23, 42. The conductive rubber lead 71 is compressible and is a commercially known material available from Chomerics, Inc.

The backing member 5 of insulating plastic also extends into recess 70 of connector member 3 against the ceramic substrate 4. Backing member 5 is provided with inclined notches 72 to receive the ends 73 of the spring clip 6. The spring clip also includes a peripheral projecting ridge 74 extending around the display viewing surface and pressing against the top of the display surface. When the flexible arms of spring clip 6 are snapped around the assembly so that the ends are nested in recesses 72, the entire assembly is compressed together in a module and the conductive rubber leads 71 are compressed making positive contact between terminals 23, 42.

Figure 8:
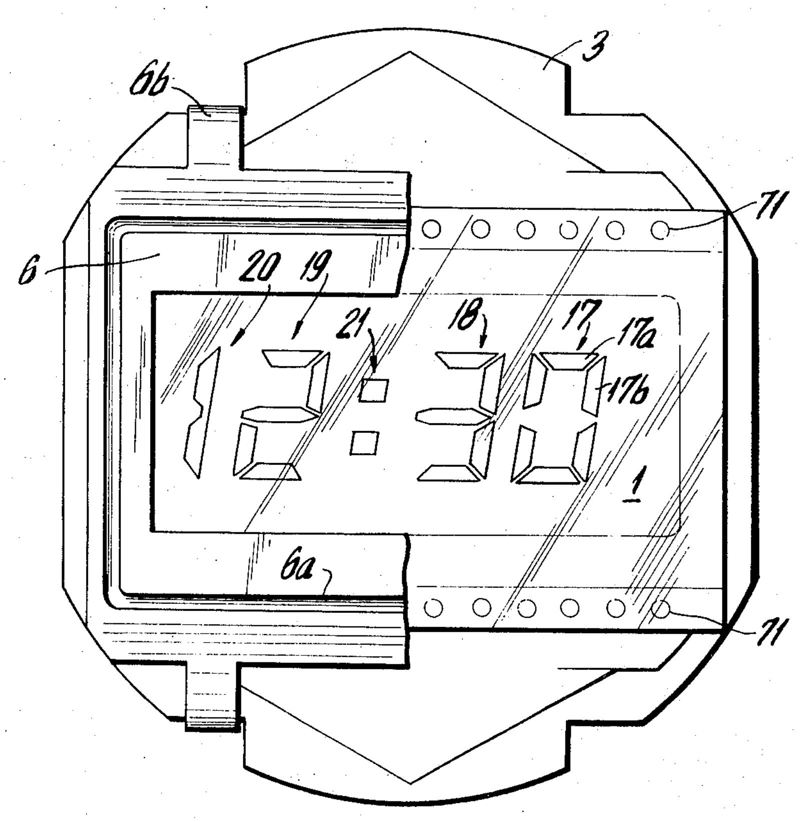
Figure 9:
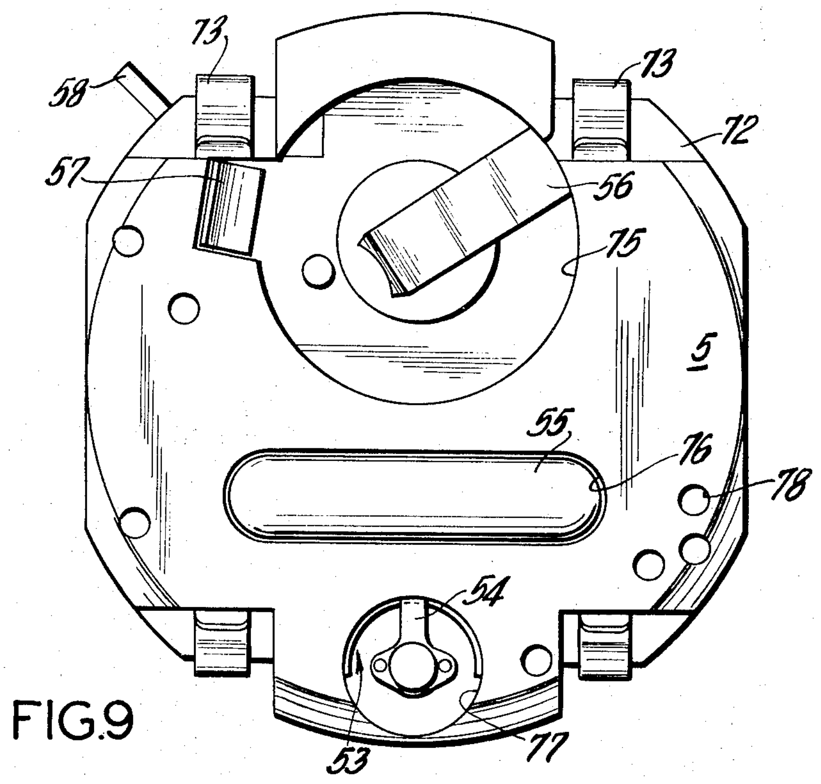

FIGS. 8 and 9 illustrate further details of the module assembly. The ends of the conductive rubber rods 71 are seen through the transparent display 1. The spring clip 6 is seen to include a window *6a* framing the display with four flexible arms *6b* passing around notches in the connector member 3.

Referring to the backside of the assembly in FIG. 9, the backing member 5 includes an aperture 75 for the battery or energy cell, an aperture 76 for the protruding quartz crystal 55, an aperture 77 for providing external access to the wiper arm 54 of the trimming resistor, and holes 78 for probes to selected test points such as 45 on the substrate.

The display/connector/substrate assembly/backing member components are assembled and fastened together using the single retaining clip 6 which provides a positive compression of all parts of the "sandwich". This compression insures adequate interconnection of the display to the substrate via the conductive rubber terminals and also eliminates all play between members of the assembly, resulting in a shock-resistant module. The skirt *3a* on the connector member partially enveloping the periphery of the substrate furthermore provides protective cushioning of the substrate.

The aforedescribed module may be assembled in a watch case and removed and disassembled with ease to replace any individual components.

While there has been described what is considered to be the preferred embodiment of the invention, it is desired to include in the appended claims all such modifications as fall within the true spirit and scope of the invention.

We claim:

1. A solid state watch module comprising:

Electrooptical display means having electrically energizable characters visible on a viewing surface and also having a first plurality of electrical contact terminals connected to said characters.

a substrate having printed circuit leads on at least one side thereof connected to a second plurality of electrical contact terminals, said substrate having an integrated circuit mounted thereon also connected to said printed circuit leads and adapted to provide driving signals to said display characters to give a time indication, an intermediate connector member having first means locating the display means on one side thereof and second means locating the substrate on the other side thereof and including electrically conductive members making contact between said first and second plurality of contact terminals, and spring clip means adapted to hold said display means, connector member and substrate together in compression and to maintain said electrically conductive members in contact with the first and second terminals.

2. The combination according to claim 1, and further including a backing member disposed on the other side of the substrate from said connector member, said spring clip being provided with flexible arms arranged to compress the backing member against the display means via the substrate and connector member.

3. The combination according to claim 2, wherein said substrate is provided with printed circuit leads on both sides thereof, said second plurality of contact terminals being connected to printed circuit leads on the display side of the substrate, and further including test point terminals connected to selected printed circuit leads in the other side of the substrate, said backing member having probe holes providing access to said test point terminals without disassembling the watch module.

4. The combination according to claim 1, wherein said first plurality of contact terminals are spaced on an undersurface of said display means, and wherein said second plurality of contact terminals are similarly spaced on the display side of said substrate, and wherein said electrically conductive members comprise a plurality of compressible conductive leads passing through said connector member and connecting respective pairs of first and second contact terminals.

5. The combination according to claim 1 including an insulating dam mounted on said substrate, said integrated circuit being disposed within said dam and surrounded by encapsulating material.

6. The combination according to claim 1, wherein said first means on the connector member comprises a first recess for receiving the display means and wherein said second means comprises a second recess for receiving the substrate, whereby the first and second contact terminals are aligned with respect to one another.

7. The combination according to claim 6, wherein an insulating backing member with exposed notches is arranged to fit in said second recess against the substrate, said spring clip means having flexible arms cooperating with said backing member notches.

8. The combination according to claim 1, wherein said spring clip has a window framing the display means viewing surface and flexible arms adapted to snap around the module.

9. The combination according to claim 1, wherein the side of the substrate opposite the display means includes a printed circuit resistor with a wiper arm providing a variable resistor accessible for adjusting the watch frequency without disassembling the module.

* * * * *